United States Patent
Gagnon (10) Patent No.: US 9,020,085 B1
(45) Date of Patent: Apr. 28, 2015

(54) METHOD AND APPARATUS FOR SAMPLING POINT OPTIMIZATION

(71) Applicant: PMC-Sierra US, Inc., Sunnyvale, CA (US)

(72) Inventor: Mathieu Gagnon, Verdun (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

(21) Appl. No.: 13/803,549

(22) Filed: Mar. 14, 2013

(51) Int. Cl.
*H04L 7/00* (2006.01)

(52) U.S. Cl.
CPC ..................................... *H04L 7/00* (2013.01)

(58) Field of Classification Search
CPC ............... H04L 25/03006; H04L 25/03019; H04L 25/03025; H04L 2025/03006; H04L 7/00
USPC .......... 375/229, 232, 326, 371, 373; 708/313, 708/322, 323
See application file for complete search history.

(56) References Cited

U.S. PATENT DOCUMENTS

| | | | |
|---|---|---|---|
| 6,731,697 B1 | 5/2004 | Boccuzzi et al. | |
| 7,545,861 B2 | 6/2009 | Seo | |
| 8,081,716 B2 | 12/2011 | Kang et al. | |
| 2003/0210752 A1* | 11/2003 | Krupka | 375/340 |
| 2006/0098766 A1* | 5/2006 | Pietraski et al. | 375/346 |
| 2009/0219980 A1* | 9/2009 | DiSanto et al. | 375/224 |

OTHER PUBLICATIONS

Gardner, "A BPSK/QPSK Timing-Error Detector for Sampled Receivers", IEEE Transactions on Communications, May 1986, vol. COM-34, No. 5, pp. 423-429, IEEE, USA.

* cited by examiner

*Primary Examiner* — Young T Tse
(74) *Attorney, Agent, or Firm* — Dennis R. Haszko (57) ABSTRACT

A method and apparatus for timing optimization are disclosed, which rely on information gathered from a timing detection circuit to find the optimal sampling point of a data recovery system. In an implementation, a timing shift is optimized based on Gardner detector data. In an example, a Gardner detector, or an early and late extraction portion thereof, is added to the data path, and the data path clock is shifted so that it is centered on the data transition mean. In an implementation, the sampling point of the data path is optimized for better horizontal eye opening using a Gardner detector's output for centering the average crossing point of different paths. In an example embodiment, an apparatus is provided with a second clock recovery that is not completely independent of a first clock recovery.

21 Claims, 6 Drawing Sheets

METHOD AND APPARATUS FOR SAMPLING POINT OPTIMIZATION

FIELD

The present disclosure relates to digital telecommunications and clock recovery.

BACKGROUND

Digital communications often require timing and data information to be extracted from an incoming distorted stream. Delays between the timing and the data recovery can be caused by many factors, in particular differences in equalization between the two paths, as well as differences in routing, loading and clock distribution.

Figure 1:
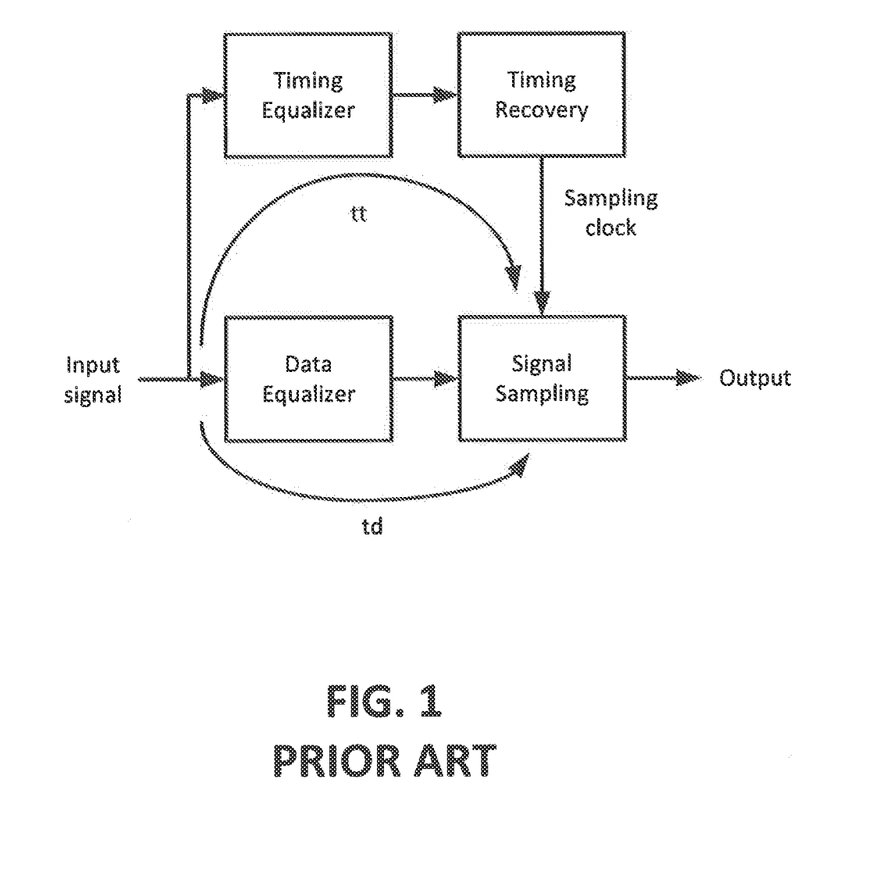
FIG. 1 illustrates timing recovery and data recovery delays contributing to a timing point variation in a known approach.

A simple method to remove this time skew is desirable. As shown in FIG. 1, the delay through the timing recovery, tt, may not produce an optimum sampling clock, relative to the delay through the data recovery, td. The difference between the two could vary according to the setting of the equalizers, the manufacturing variations in the circuits and the environmental conditions.

Timing offsets between the timing recovery and the data recovery paths result in reduced system performance.

It is, therefore, desirable to provide a method and apparatus that reduces or removes time skew between two paths.

BRIEF DESCRIPTION OF THE DRAWINGS

Embodiments of the present disclosure will now be described, by way of example only, with reference to the attached Figures.

DETAILED DESCRIPTION

Generally, the present disclosure provides a method and apparatus for timing optimization, which rely on information gathered from a timing detection circuit to find the optimal sampling point of a data recovery system. In an implementation, a timing shift is optimized based on Gardner detector data. In an example, a Gardner detector, or an early and late extraction portion thereof, is added to the data path, and the data path clock is shifted so that it is centered on the data transition mean. In an implementation, the sampling point of the data path is optimized for better horizontal eye opening using a Gardner detector's output for centering the average crossing point of different paths. In an example embodiment, an apparatus is provided with a second clock recovery that is not completely independent of a first clock recovery.

In an embodiment, the present disclosure provides a method of optimizing a timing delay between a timing path and a data path, comprising: a) adding a first programmable delay to a reference signal to produce a first delayed reference signal, the reference signal being generated by a timing recovery circuit in the timing path and synchronized with the average center of the eye; b) adding a second delay to the first delayed reference signal to produce a second delayed reference signal; c) sampling an equalized input data signal using the first and second delayed reference signals, the equalized input data signal being generated by a data recovery circuit in the data path; d) obtaining indications, for each of a plurality of observed data signal transitions, of whether the observed data signal transition is early or late compared to observed reference signal transitions, based on the sampling; and e) adjusting the first programmable delay added to the reference signal based on the determined early and late indications.

In an example embodiment, d) comprises: obtaining a digital signal indicating the presence or absence of a transition in the reference signal; accumulating the number of early and late signals for a pre-defined number data signal transitions; and storing the accumulated early and late signals as a function of the second delay.

In an example embodiment, the method further comprises: computing an optimal main sampling point based on an average location between points of equal, but opposite, early-late accumulation values.

In an example embodiment, the method further comprises: repeating a) through e) for a plurality of different values of the second delay; and adjusting the programmable delay as a function of the accumulated early and late signals for all of the different values of the second delay.

In an example embodiment, a range of variation of the second delay is reduced in subsequent iterations. In an example embodiment, a step size of the second delay is reduced in subsequent iterations. In an example embodiment, the duration of the accumulation is increased in subsequent iterations.

In an example embodiment, the method further comprises accumulating the difference between the early and late signal. In an example embodiment, e) comprises: computing a first interpolated delay based on a first delay value for which the difference between the early and late signals is equal to a positive pre-defined value; computing a second interpolated delay based on a second delay value for which the difference between the early and late signals is equal to a negative pre-defined value; and setting the first programmable delay as half of the sum of 1 bit interval plus the first and second interpolated delays.

In an example embodiment, the second delay comprises a fixed delay, and d) comprises: computing the difference between early and late signals; and filtering the difference between the early and late signals; and wherein e) comprises: adjusting the first programmable delay based on the filtered difference between the early and late signals. In an example embodiment, the method further comprises continuously increasing or decreasing the first delay according to the filtered difference between the early and late signals. In an example embodiment, the procedure is stopped after the first delay settles to a stable value.

In an example embodiment, the second fixed delay is set to half a bit period. In an example embodiment, an adjustment step size for the first delay is reduced in subsequent iterations. In an example embodiment, characteristics of the filtering are modified in subsequent iterations.

In another embodiment, the present disclosure provides an equalization adaptation apparatus comprising: a timing recovery circuit, providing, from an input signal, a reference signal approximately aligned with the center of each bit period; a first programmable delay element generating a first delayed version of the reference signal; a second programmable delay element generating a second delayed version of the reference signal by delaying the first delayed version of the reference signal; a sampling circuit configured to generate first and second sets of digital samples of the input signal, using the first and second delayed versions of the reference signal, respectively; an early/late extractor for computing, from the first and second set of samples, early and late signals that represent whether transitions of the input signal are respectively early or late with respect to the second delayed reference signal; and a phase control processor configured to control the first and second delay elements based on the computed early and late signals.

In an example embodiment, the sampling circuit comprises: a first sampler, generating the first set of digital samples of the input signal, using the first delayed version of the reference signal; and a second sampler, generating the second set of digital samples of the input signal, using the second delayed version of the reference signal. In an example embodiment, the first and second samplers generate the first and second sets of digital samples after equalization.

In an example embodiment, the apparatus further comprises: an accumulation circuit accumulating the number of early and late signals; a transition detection circuit for detecting and accumulating the number of transitions of the input signal; and a memory for storing the accumulated early and late signals and the accumulated number of transitions; wherein the phase control processor is configured to control the accumulation circuit and to control the first and second delays based on the stored accumulated early and late signals and the accumulated number of transitions.

In a further embodiment, the present disclosure provides a method of setting skew between two signals comprising: adding a first programmable delay to a first signal to produce a first delayed signal; adding a second delay to the first delayed signal to produce a second delayed signal; sampling a second signal using the first and second delayed signals; determining, for each of a plurality of observed transitions of the second signal, whether the observed transition is early or late compared to observed transitions of the first signal; and adjusting the programmable delay added to the first signal based on the determined early and late indications.

In an embodiment, the present disclosure provides a method and apparatus for timing shift optimization, for example in sampling point optimization. In another embodiment, the present disclosure provides a method and apparatus adjusting skew.

Other aspects and features of the present disclosure will become apparent to those ordinarily skilled in the art upon review of the following description of specific embodiments in conjunction with the accompanying figures.

As telecommunication systems gain in data rate, optimization of performance is desirable, and often required, to keep long reaches. A sub-optimal sampling point leads to performance reduction, and thus reduction of rate and/or reach attainable by a system.

Due to the asymmetry in the shape of the eye, optimization of time skew so as to produce a maximally-opened eye in the time dimension (often referred as the horizontal eye) is beneficial. Asymmetry in the equalized eye results in an optimal sampling instant. Finding this optimal sampling instant increases the system performance Embodiments of the present disclosure are based upon the non-obvious usage of circuits to optimize delays between the data and the timing path. Embodiments allow finding optimal delay even in the presence of asymmetrical threshold-crossing distributions.

Embodiments of the present disclosure relate to optimizing a timing shift based on Gardner detector data. In an example embodiment, a Gardner detector, or a portion thereof, is added to the data path, and the data path clock is shifted so that it is centered on the data transition mean. In an example embodiment, the sampling point of the data path is optimized for better horizontal eye opening using a Gardner detector's output for centering the average crossing point of different paths. In an example embodiment, an apparatus is provided with a second clock recovery that is not completely independent of a first clock recovery. In an example embodiment, the Gardner detector, or portion thereof, is added on the data path itself to align the clock coming from the timing path.

Embodiments of the present disclosure provide a method and apparatus to optimize the data sampling instant so as to reduce or cancel skew between the timing and the data path. Other embodiments of the present disclosure optimize the skew between these two paths to maximally open the eye.

Figure 2:
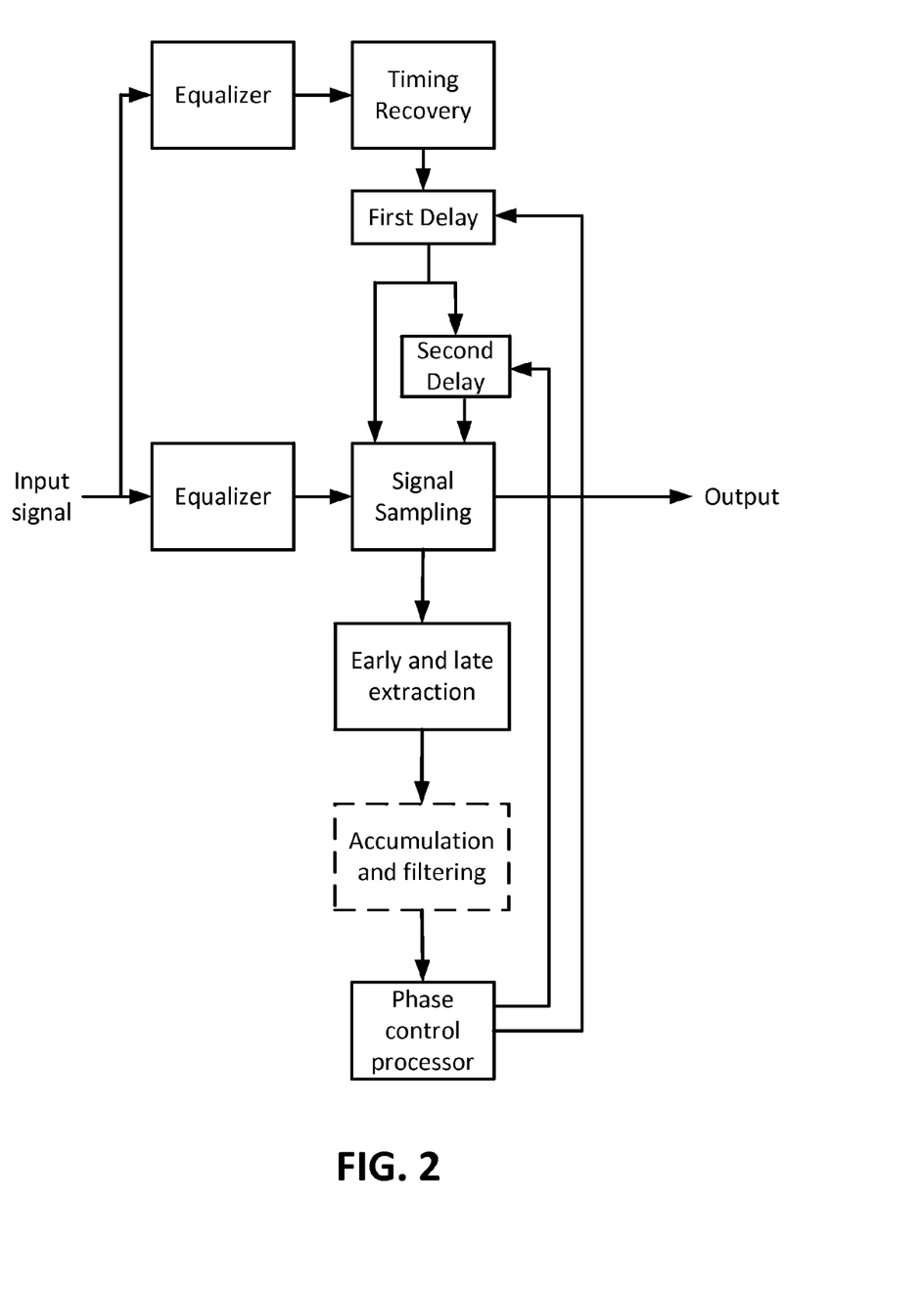
FIG. 2 is a block and flow diagram illustrating a sampling point optimization method according to an embodiment of the present disclosure.

FIG. 2 is a block and flow diagram illustrating a sampling point optimization method according to an embodiment of the present disclosure. In this diagram, an input signal is provided to a first equalizer, and a first equalized signal is provided to a timing recovery circuit. The input signal is also provided to a second equalizer, and a second equalized signal is provided to a signal sampling circuit.

As shown in FIG. 2, in an embodiment the present disclosure provides a method to optimize the delay between two signals, comprising the steps of:

1) providing a first delayed reference signal by adding a first programmable delay to a reference signal synchronized with the average center of the eye, as generated by the timing recovery circuit;

2) providing a second delayed reference signal by adding a second programmable delay to the first delayed reference signal;

3) extracting early and late information, using an early and late extractor, from the second equalized signal and the first and second delayed reference signals and;

4) optionally filtering (for example, accumulating) the extracted early and late information using a filtering/accumulation circuit;

5) repeating steps 1) through 3) for different values of the second or first programmable delay;

6) adjusting the first delay according to a function combining the early and late information and number of transitions gathered from the different values of the second delay.

Figure 3:
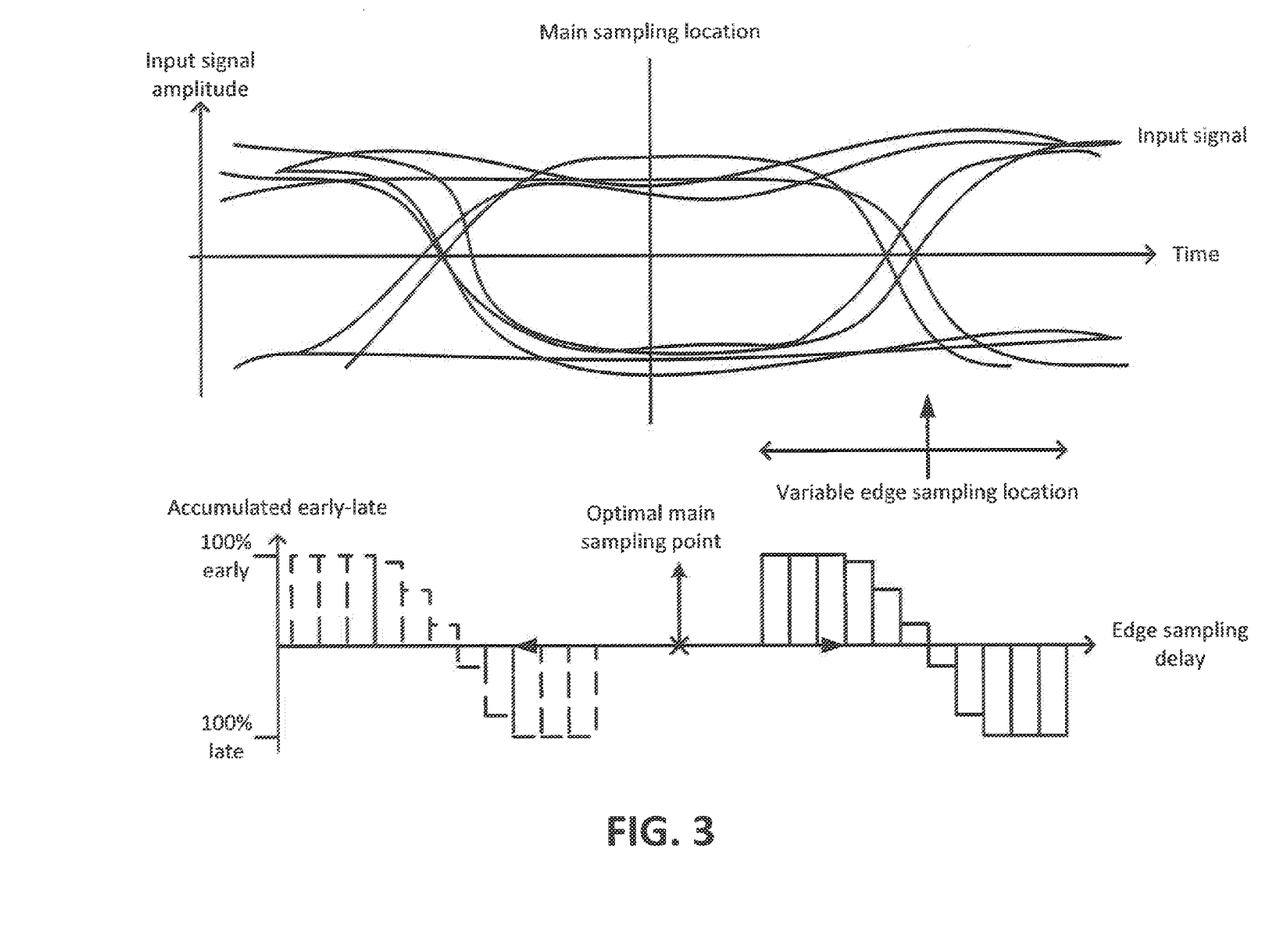
FIG. 3 illustrates a sampling point optimization eye diagram according to an embodiment of the present disclosure.

In this example method, the phase control processor first modifies the edge delay and accumulates the early-late signals for each edge delay, keeping constant the main sampling location, near the center of the eye. After sufficient accumulation, the optimal main sampling point is computed from the average location between points of equal, but opposite, early-late accumulation values, as shown in FIG. 3. Those skilled in the art will recognize that the main sampling point is chosen so as to obtain maximal margin on both sides of the eye. In this example, the threshold is chosen as 100% early or late.

After the optimal main sampling point is determined, the phase control updates the main delay to this location. In an embodiment, this timing point variation is performed in small steps to prevent abrupt changes in the rest of the data recovery path.

Figure 4:
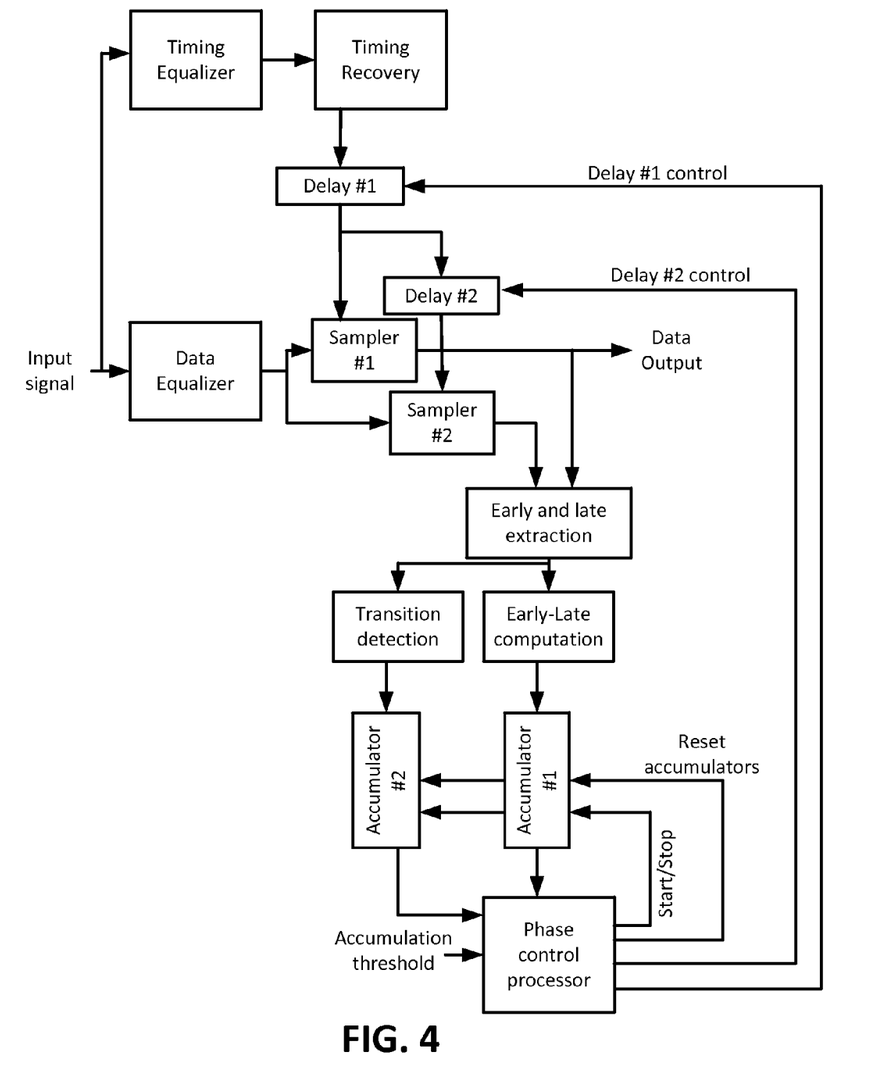
FIG. 4 is a block and flow diagram illustrating a sampling point optimization method according to an example embodiment of the present disclosure.

FIG. 4 is a block and flow diagram illustrating a sampling point optimization method according to an example embodiment of the present disclosure. For simplicity, many of these blocks have digital clock references that are not included, as well as other synchronization, reset and initialization signals that will be evident to those skilled in the art.

A timing equalizer receives as input the digital signal to be recovered, and outputs a timing-equalized signal. This timing-equalized signal is connected to the input of a timing recovery circuit, which outputs a reference sampling signal approximately synchronized with the center of the eye. This reference sampling signal is connected to a first delay element, which outputs a first delayed reference sampling signal. This first delayed reference sampling signal is also connected to a second delay element, which outputs a second delayed reference sampling signal.

A data equalizer receives as input the digital signal to be recovered, and outputs a data-equalized signal. A first sampler receives as input the data-equalized signal and the first delayed reference sampling signal, and outputs a recovered data sample.

A second sampler receives as input the data-equalized signal and the second delayed reference sampling signal, and outputs a recovered edge sample.

An early and late extraction circuit receives as input the recovered data sample and recovered edge sample, and outputs early and late signals. This circuit is well known to those skilled in the art as the front end of a Gardner detector (reference: F. M. Gardner, "A BPSK/QPSK timing-error detector for sampled receivers", IEEE Trans. Commun., vol. COM-34, pp. 423-429 1986). The early signal carries a value of 1 if a transition occurred earlier than the edge sampling reference, and a value of 0 if either no transition occurred or a transition occurred later than the edge sampling reference. The late signal carries a value of 1 if a transition occurred later than the edge sampling reference, and a value of 0 if either no transition occurred or a transition occurred earlier than the edge sampling reference.

An early-late computation circuit receives the early and late signals and outputs their difference.

A transition detection circuit receives the early and late signals and outputs a signal indicating the presence of either of them (OR function).

A first accumulator is connected to the output of the early-late computation circuit. A second accumulator is connected to the output of the transition detection circuit.

In addition to the above input signals, the first accumulator takes as inputs a Reset signal and a Start/Stop signal.

In an example embodiment, each accumulator comprises control logic, a summation unit, and a memory element that holds and outputs the current value.

When the Reset signal indicates reset, the control logic resets the memory element to zero, which also brings the output to zero.

When the Reset signal does not indicate reset, and when the Start/Stop signal indicates start, the accumulator sums the difference input with its previous value to create the updated accumulated value.

When the Reset signal does not indicate reset, and when the Start/Stop signal indicates stop, the accumulator keeps the output of the accumulator constant, ignoring any input difference.

A phase control processor circuit receives as input the result of the accumulators and a positive target early-late ratio. It outputs a Start/Stop signal and a Reset signal to the accumulators. It also outputs the delay control signals for the first and the second delay elements.

In an embodiment, the phase control processor circuit implements the following sequential logic:

1) Set the first delay to zero, and set the second delay to ½ uniform integer (UI);
2) Set the Start/Stop signal to Stop;
3) Assert the reset signal to the accumulator, wait for the reset to occur, and de-assert the reset signal;
4) Set the Start/Stop signal to Start;
5) Monitor the output of the accumulated number of transitions until it reaches the accumulation threshold value;
6) Set the Start/Stop signal to Stop;
7) Compute the ratio between the accumulated early-late difference, and the accumulated number of transitions (early-late ratio);
8) Store the metric for the current equalization parameter into a memory element corresponding to the current delay;
9) Set the second delay to a different value, out of a range of delays to be tested;
10) Repeat steps 3) through 9) for all the delays to be tested;
11) Interpolate the delay for which the early-late ratio is equal to the target early-late ratio (delayPos);
12) Interpolate the delay for which the early-late ratio is equal to the opposite of the early-late ratio (delayNeg);
13) Compute the optimal delay as (delayNeg−1 UI+delayPos)/2;
14) Set the first delay to the optimal delay, and the second delay to ½ UI; and
15) Repeat steps 3) through 14).

Other equivalent implementations can be found by those skilled in the art, for example, the delay elements can be implemented as phase interpolators taking as input a plurality of reference sampling signals with well-controlled phase alignments.

In an embodiment, the phase control repeats the procedure after the adjustment of the first delay, to further optimize the main sampling point.

In an embodiment, the range of variation of the second delay is reduced in subsequent iterations, to focus only on the area where the desired early-late probability is expected.

In an embodiment, the step size of the second delay is reduced in subsequent iterations, to achieve a faster initial convergence, and refine its precision afterwards.

In an embodiment, the duration of the accumulation is increased in subsequent iterations, to improve the precision of the optimal main sampling point.

In an embodiment, the delayed reference signal for the second sampler is generated from the reference signal.

In an embodiment, the first sampler used for timing point optimization is also used for data recovery.

In an embodiment, all or some of the samplers are analog-to-digital converters.

Figure 5:
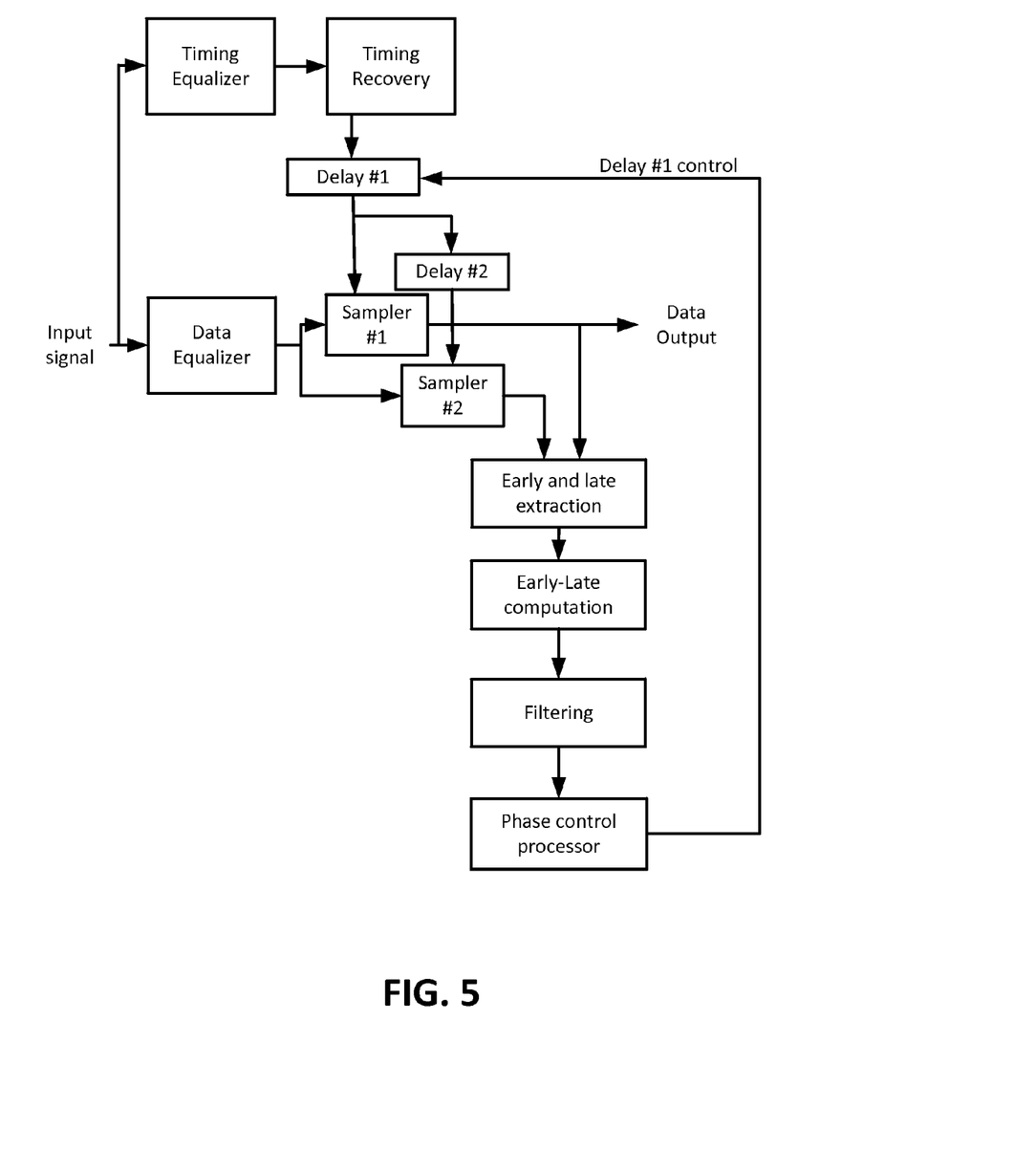
FIG. 5 is a block and flow diagram illustrating a sampling point optimization method according to another example embodiment of the present disclosure.

FIG. 5 is a block and flow diagram illustrating a sampling point optimization method according to an example embodiment of the present disclosure. This embodiment has similar description as the embodiment of FIG. 4, with the following additions and changes:

1) The second delay is constant;
2) There is no generation or accumulation of the number of transitions;
3) The difference between early and late indications is filtered by a filtering circuit instead of being accumulated;
4) The phase control processor does not have Start-Stop and Reset outputs;
5) The phase control processor does not control the second delay; and
6) The phase control processor increments or decrements the first delay according to the signal received from the filtering circuit.

Filtering is a more general processing than accumulating, which is a form of digital filtering.

In an embodiment, the phase control processor operates continuously.

In an embodiment, the phase control processor operates until the first delay value settles to a stable condition, after which unused circuits can be powered off.

In an embodiment, the delayed reference signal for the second sampler is delayed by half a bit period from the delayed reference signal for the first sampler.

In an embodiment, the size of the first delay steps is reduced in subsequent iterations, to achieve a faster initial convergence, and refine its precision afterwards.

In an embodiment, the characteristics of the filtering are modified in subsequent iterations, to improve the precision of the optimal main sampling point.

Embodiments can provide early and late information in the form of a digital signal indicating only if the current signal transition is early or if it is late relative to an average reference. Other embodiments can provide early and late information that has variable amplitude according to how early or late the current signal transition is, relative to an average reference.

Other circuits, such as offset compensation circuits, are known to those skilled and can be added to the example embodiments provided herein.

Those skilled in the art will further recognize that many different implementations are possible, including half rate implementations, variations of the timing recovery circuit implementation and of the equalization functions and variations of the filtering functions.

Figure 6:
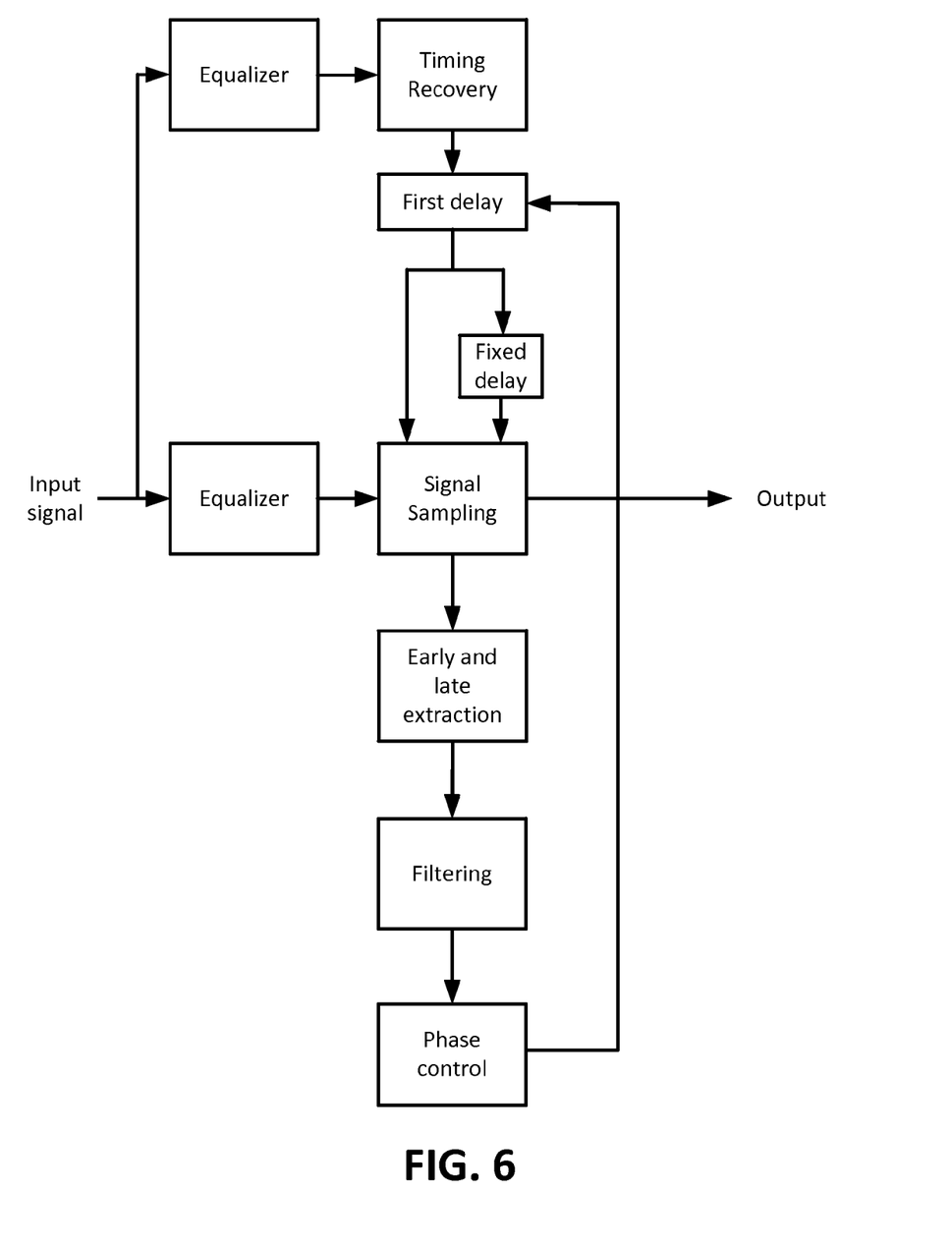
FIG. 6 is a block and flow diagram illustrating a sampling point optimization method according to a further example embodiment of the present disclosure.

FIG. 6 is a block and flow diagram illustrating a sampling point optimization method according to a further example embodiment of the present disclosure. Similar to FIG. 2, the embodiment of FIG. 6 includes a general signal sampling circuit, early and late extraction circuit, and a filtering circuit. The second delay in the embodiment of FIG. 6 is fixed. Also, when compared to the embodiment of FIG. 5, the embodiment of FIG. 6 does not include the early-late computation circuit.

A new skew setting method and apparatus have been presented herein to optimize data recovery systems.

In an embodiment, the present disclosure provides a method to set the skew between two signals, comprising: providing a first delayed version of a first signal (for example, a timing reference) by adding a first delay; providing a further delayed version of the first delayed signal by adding a second delay; sampling a second signal (for example, a data signal) with the first and second delayed versions of the first signal; from the samples of the second signal, computing a digital signal indicating whether each observed transition of the second signal is early or late compared to the transitions of the first signal; obtaining a digital signal indicating the presence or not of a transition in the first signal; accumulating the number of early and late signals for a pre-defined number of transitions of the second signal; storing the accumulated early and late signals as a function of the second delay; repeating the above process for a plurality of delays of the second signal; and adjusting the first delay from a function of the accumulated early and late signals for all the second delays used.

In an example embodiment, the procedure is repeated after the adjustment of the first delay. In an example embodiment, the range of variation of the second delay is reduced in subsequent iterations. In an example embodiment, the step size of the second delay is reduced in subsequent iterations. In an example embodiment, the duration of the accumulation is increased in subsequent iterations. In an example embodiment, the difference between the early and late signal is accumulated. In an example embodiment, the adjustment of the first delay is performed using the following procedure: compute a first interpolated delay by finding the delay for which the difference between the early and late signals would be equal to a positive pre-defined value; compute a second interpolated delay by finding the delay for which the difference between the early and late signals would be equal to a negative pre-defined value; and set the first delay as half of the sum of 1 bit interval plus the first and second interpolated delays.

In another embodiment, the present disclosure provides a method to set the skew between two signals, comprising: providing a first delayed version of a first signal (for example, a timing reference) by adding a first delay; providing a further delayed version of the first delayed signal by adding a second, fixed delay; sampling a second signal (for example, a data signal) with the first and second delayed versions of the first signal; from the samples of the second signal, computing a digital signal indicating whether each observed transition of the second signal is early or late compared to the transitions of the first signal; computing the difference between the early and late signals; filtering the difference between the early and late signals; and continuously increasing or decreasing the first delay according to the filtered difference between the early and late signals.

In an example embodiment, the procedure is stopped after the first delay settles to a stable value. In an example embodiment, the second fixed delay is set to half a bit period. In an example embodiment, the size of the first delay steps is reduced in subsequent iterations. In an example embodiment, the characteristics of the filtering are modified in subsequent iterations.

In a further embodiment, the present disclosure provides an equalization adaptation engine comprising: a timing recovery circuit, providing, from an input signal, a reference signal approximately aligned with the center of each bit period; a first programmable delay element generating a first delayed version of the reference signal; a second programmable delay element generating a second delayed version of the reference signal by delaying the first delayed version of the reference signal; a first sampler, generating a first set of digital samples of the input signal, possibly after equalization, using the first delayed version of the reference signal; a second sampler, generating a first set of digital samples of the input signal, possibly after equalization, using the second delayed version of the reference signal; means for computing, from the first and second set of samples, early and late signals that represent whether the transitions of the possibly equalized input signal are respectively early or late with respect to the second delayed reference signal; means for accumulating the number of early and late signals; means for detecting and accumulating the number of transitions of the possibly equalized input signal; means for storing the accumulated values; means for controlling the accumulators, storing their values, and controlling the first and second delays, based upon the results of the stored accumulated early and late signals and the accumulated number of transitions.

In an example embodiment, the second delayed reference signal is computed by adding a delay to the reference signal, and the aforementioned delay is equivalent to the sum of the first and second delays. In an example embodiment, the number of bits received is used instead of the number of transitions. In an example embodiment, the early and late indications carry the amplitude of the time difference between the transition time and the reference. In an example embodiment, all or some of the samplers are implemented as analog-to-digital converters.

In another embodiment, the present disclosure provides an equalization adaptation engine comprising: a timing recovery circuit, providing, from an input signal, a reference signal approximately aligned with the center of each bit period; a first programmable delay element generating a first delayed version of the reference signal; a second fixed delay element generating a second delayed version of the reference signal by delaying the first delayed version of the reference signal; a first sampler, generating a first set of digital samples of the input signal, possibly after equalization, using the first delayed version of the reference signal; a second sampler, generating a first set of digital samples of the input signal, possibly after equalization, using the second delayed version of the reference signal; means for computing, from the first and second set of samples, early and late signals that represent whether the transitions of the possibly equalized input signal are respectively early or late with respect to the second delayed reference signal; means for computing the difference between the early and late signals; means for filtering the difference between the early and late signals; means for continuously increasing or decreasing the first delay according to the filtered difference between the early and late signals, in order to reduce the average between the early and late signals.

In an example embodiment, the second delayed reference signal is computed by adding a delay to the reference signal; and the aforementioned delay is equivalent to the sum of the first and fixed delays. In an example embodiment, the early and late indications carry the amplitude of the time difference between the transition time and the reference. In an example embodiment, all or some of the samplers are implemented as analog-to-digital converters.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A method of optimizing a timing delay between a timing path and a data path, comprising:
   a) adding a first programmable delay to a reference signal to produce a first delayed reference signal, the reference signal being generated by a timing recovery circuit in the timing path and synchronized with an average center of an eye of each bit period in an equalized input signal;
   b) adding a second delay to the first delayed reference signal to produce a second delayed reference signal;
   c) sampling the equalized input signal using the first and second delayed reference signals, the equalized input signal being generated by an equalizer in the data path;
   d) for each of a plurality of observed transitions in the equalized input signal, obtaining an early-late indication of whether an observed transition in the equalized input signal is early or late compared to an observed transition in the reference signal, based on the sampling, the observed transition in the equalized input signal being among the plurality of observed transitions in the equalized input signal; and
   e) adjusting the first programmable delay added to the reference signal based on the early-late indication.

2. The method of claim 1 wherein d) further comprises:
   for each of the plurality of observed transitions in the equalized input signal, obtaining a digital signal indicating the presence of the transition in the equalized input signal;
   accumulating the obtained digital signals to obtain a number of observed transitions;
   accumulating the early-late indications until the number of observed transitions is equal to a pre-defined number of transitions to obtain an early-late accumulation value; and
   storing the early-late accumulation value as a function of the second delay.

3. The method of claim 2 further comprising:
   repeating a) through e) for a plurality of different values of the second delay, the repeating of a) through e) representing a plurality of iterations including a first iteration and a second iteration; and
   adjusting the first programmable delay as a function of the early-late accumulation values for all of the different values of the second delay.

4. The method of claim 3 further comprising: computing an optimal main sampling point based on an average location between points of equal, but opposite, early-late accumulation values.

5. The method of claim 3 wherein a range of variation of the second delay is reduced in the second iteration.

6. The method of claim 3 wherein a step size of the second delay is reduced in the second iteration.

7. The method of claim 3 wherein steps a) to e) represent an iteration, and wherein a pre-defined threshold number of observed transitions in the equalized input signal is increased in the second iteration.

8. The method of claim 2 wherein obtaining the early-late indication further comprises:
   obtaining an early signal when the observed transition in the equalized input signal is early compared to the observed transition in the reference signal based on the sampling; and obtaining a late signal when the observed transition in the equalized input signal is late compared to the observed transition in the reference signal based on the sampling;

wherein the method further comprises accumulating the difference between the early signal and the late signal.

9. The method of claim 8 wherein the adjusting comprises:
computing a first interpolated delay based on a first delay value for which the difference between the early signal and the late signal is equal to a positive pre-defined value;
computing a second interpolated delay based on a second delay value for which the difference between the early signal and the late signal is equal to a negative pre-defined value; and
setting the first programmable delay as half of the sum of 1 bit interval plus the first and second interpolated delays.

10. The method of claim 1 wherein performing a) through e) represents a first iteration and wherein
the second delay comprises a fixed delay;
obtaining the early-late indication further comprises:
obtaining an early signal when the observed transition in the equalized input signal is early compared to the observed transition in the reference signal based on the sampling;
obtaining a late signal when the observed transition in the equalized input signal is late compared to the observed transition in the reference signal based on the sampling;
computing a difference between the early signal and the late signal; and
filtering the difference between the early signal and the late signal;
the adjusting comprises:
adjusting the first programmable delay based on the filtered difference between the early signal and the late signal.

11. The method of claim 10 further comprising continuously increasing or decreasing the first programmable delay according to the filtered difference between the early signal and the late signal.

12. The method of claim 11 wherein the continuously increasing or decreasing the first programmable delay according to the filtered difference between the early signal and the late signal is stopped after the first programmable delay settles to a stable value.

13. The method of claim 10 wherein the fixed delay is set to half a bit period.

14. The method of claim 11 wherein continuously increasing or decreasing the first programmable delay according to the filtered difference between the early signal and the late signal comprises continuously increasing or decreasing the first programmable delay by an adjustment step size, and wherein the adjustment step size is reduced in a second iteration subsequent to the first iteration.

15. The method of claim 10 wherein characteristics of the filtering are modified in a second iteration subsequent to the first iteration.

16. An equalization adaptation apparatus comprising:
a timing recovery circuit, providing, from an input signal, a reference signal approximately aligned with an average center of an eye of each bit period in an equalized input signal;
a first programmable delay element generating a first delayed version of the reference signal;
a second programmable delay element generating a second delayed version of the reference signal by delaying the first delayed version of the reference signal;
a sampling circuit configured to generate first and second sets of digital samples of the equalized input signal, using the first and second delayed versions of the reference signal, respectively;
an early-late extractor for computing, from the first and second set of digital samples, early and late signals that represent whether transitions of the input signal are respectively early or late with respect to the second delayed version of the reference signal; and
a phase control processor configured to control the first and second programmable delay elements based on the computed early and late signals.

17. The apparatus of claim 16 wherein the sampling circuit comprises:
a first sampler, generating the first set of digital samples of the equalized input signal, using the first delayed version of the reference signal; and
a second sampler, generating the second set of digital samples of the equalized input signal, using the second delayed version of the reference signal.

18. The apparatus of claim 17 further comprising an equalizer for equalizing the input signal to generate the equalized input signal and wherein the first and second samplers generate the first and second sets of digital samples from the equalized input signal.

19. The apparatus of claim 16 further comprising:
an accumulation circuit accumulating a number of the early and late signals;
a transition detection circuit for detecting and accumulating a number of the transitions of the input signal; and
a memory for storing the accumulated early and late signals and the accumulated number of transitions;
wherein the phase control processor is configured to control the accumulation circuit and to control the first and second programmable delay elements based on the stored accumulated early and late signals and the accumulated number of transitions.

20. A method of setting skew between two signals comprising:
adding a first programmable delay to a first signal to produce a first delayed signal;
adding a second delay to the first delayed signal to produce a second delayed signal;
sampling a second signal using the first and second delayed signals;
for each of a plurality of observed transitions of the second signal, obtaining an indication whether an observed transition of the second signal is early or late compared to an observed transition of the first signal, the observed transition of the second signal being among the plurality of observed transitions of the second signal; and
adjusting the first programmable delay added to the first signal based on the obtained indications to produce an adjusted first delayed signal in relation to which the skew is set.

21. A method of optimizing a timing delay between a timing path and a data path, comprising:
a) adding a first programmable delay to a reference signal to produce a first delayed reference signal, the reference signal being generated by a timing recovery circuit in the timing path and synchronized with an average center of an eye of each bit period in an equalized input signal, the equalized input signal being generated by an equalizer in the data path;
b) adding a second delay to the first delayed reference signal to produce a second delayed reference signal;

c) sampling the equalized input signal at each bit period using the first delayed reference signal to generate a plurality of recovered data samples;
d) sampling the equalized input signal at each bit period using the second delayed reference signal to generate a plurality of recovered edge samples;
e) for each bit period:
   determining whether a transition in the equalized input signal occurred by comparing a recovered data sample for a current bit period to a recovered data sample for a previous bit period;
   setting an early signal to one when the transition in the equalized input signal occurs and a recovered edge sample is early compared to the transition;
   setting a late signal to one when the transition in the equalized input signal occurs and the recovered edge sample is late compared to the transition; and
   setting both the early signal and the late signal to zero when no transition in the equalized input signal occurs;
f) averaging, for each bit period, a sum of the early signal and the late signal to obtain a number of transitions in the equalized input signal;
g) averaging, for each bit period, a difference between the early signal and the late signal until the number of transitions in the equalized input signal is equal to a predefined number of transitions to obtain an early-late accumulation value;
h) storing the early-late accumulation value;
i) repeating a) through h) for a plurality of different values of the second delay; and
j) adjusting the first programmable delay added to the reference signal based on the stored early-late accumulation value.

* * * * *